(12) United States Patent
Lin et al.

(10) Patent No.: US 11,532,543 B2
(45) Date of Patent: Dec. 20, 2022

(54) MANUFACTURING METHOD OF PACKAGE CARRIER

(71) Applicant: Unimicron Technology Corp., Taoyuan (TW)

(72) Inventors: Wei-Ti Lin, Hsinchu County (TW); Chun-Hsien Chien, Hsinchu (TW); Yu-Hua Chen, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/402,635

(22) Filed: Aug. 16, 2021

(65) Prior Publication Data

US 2021/0398894 A1 Dec. 23, 2021

Related U.S. Application Data

(62) Division of application No. 16/942,743, filed on Jul. 29, 2020, now Pat. No. 11,139,234.

(30) Foreign Application Priority Data

Jun. 23, 2020 (TW) ................. 109121264

(51) Int. Cl.
*H05K 1/03* (2006.01)
*H01L 23/498* (2006.01)
*H01L 21/48* (2006.01)
*H05K 1/18* (2006.01)

(52) U.S. Cl.
CPC ...... *H01L 23/49838* (2013.01); *H01L 21/481* (2013.01); *H01L 21/4853* (2013.01); *H05K 1/185* (2013.01); *H01L 23/49816* (2013.01); *H05K 1/182* (2013.01); *H05K 2201/10378* (2013.01)

(58) Field of Classification Search
CPC ................. H05K 1/0306; H05K 1/185; H05K 2201/10378
See application file for complete search history.

(56) References Cited

U.S. PATENT DOCUMENTS

| 2012/0286419 A1* | 11/2012 | Kwon | H01L 25/0657 257/737 |
| 2014/0102772 A1* | 4/2014 | Chen | H05K 3/4602 29/843 |
| 2015/0359098 A1* | 12/2015 | Ock | H05K 1/115 29/842 |

* cited by examiner

*Primary Examiner* — Sherman Ng
(74) *Attorney, Agent, or Firm* — JCIPRNET (57) ABSTRACT

A package carrier includes a substrate, at least one interposer disposed in at least one opening of the substrate, a conductive structure layer, a first build-up structure, and a second build-up structure. The interposer includes a glass substrate, at least one conductive via, at least one first pad, and at least one second pad. The conductive via passes through the glass substrate, and the first and the second pads are disposed respectively on an upper surface and a lower surface of the glass substrate opposite to each other and are connected to opposite ends of the conductive via. The conductive structure layer is disposed on the substrate and is structurally and electrically connected to the first and the second pads. The first and the second build-up structures are disposed respectively on the first and the second surfaces of the substrate and are electrically connected to the conductive structure layer.

5 Claims, 10 Drawing Sheets

MANUFACTURING METHOD OF PACKAGE CARRIER

CROSS-REFERENCE TO RELATED APPLICATION

This application is a divisional application of and claims the priority benefit of U.S. application Ser. No. 16/942,743, filed on Jul. 29, 2020, now allowed, which claims the priority benefit of Taiwan application serial no. 109121264, filed on Jun. 23, 2020. The entirety of each of the above-mentioned patent applications is hereby incorporated by reference herein and made a part of this specification.

BACKGROUND

Technical Field

The disclosure relates to a substrate structure and a manufacturing method thereof, and particularly to a package carrier and a manufacturing method thereof.

Description of Related Art

The structure of the current embedded passive substrate (EPS) can only be connected on one side, and the wires cannot be laid on the back of the passive component, which prevents it from being utilized effectively. Generally, the passive component and the substrate are connected through a conductive blind hole; alternatively, the conductive pattern on the substrate is connected directly to the contact of the passive component to configure a single-sided wiring layout. Since the conductive blind hole has more connection interfaces, that is, there are upper and lower connection interfaces, it may easily cause poor conductivity. Moreover, the conductive blind hole also has the feature of a small contact area at its bottom. During the desmear process, if the smear left at the bottom of the hole cannot be removed effectively, it may result in poor electrical reliability. In addition, most of the current substrates are copper-foil substrates. Due to their material characteristics, irregular warpage may also occur easily, causing a poor coplanarity in the chip packaging area. As the wafers cannot be arranged effectively in the packaging area on the copper-foil substrate, this may further cause a low packaging yield. Also, the passive component is smaller in size and cannot provide a rigid support structure for the packaging area.

SUMMARY

Accordingly, the disclosure provides a package carrier which provides a better coplanarity.

The disclosure also provides a manufacturing method of a package carrier for manufacturing the package carrier mentioned above, which improves the chip package yield and structural rigidity, providing better conductive performance and better structural reliability.

The disclosure provides a package carrier, including a substrate, at least one interposer, a conductive structure layer, a first build-up structure, and a second build-up structure. The substrate has a first surface and a second surface opposite to each other and at least one opening connecting the first surface and the second surface. The interposer is disposed in the opening of the substrate, and the interposer includes a glass substrate, at least one conductive via, at least one first pad, and at least one second pad. The conductive via passes through the glass substrate, and the first pad and the second pad are disposed respectively on an upper surface and a lower surface of the glass substrate opposite to each other and are connected to the opposite ends of the conductive via. The conductive structure layer is disposed on the substrate and is structurally and electrically connected to the first pad and the second pad. The first build-up structure is disposed on the first surface of the substrate and is electrically connected to the conductive structure layer. The second build-up structure is disposed on the second surface of the substrate and is electrically connected to the conductive structure layer.

In an embodiment of the disclosure, the package carrier mentioned above further includes an insulating layer filling the opening of the substrate, covering the upper surface and the lower surface of the glass substrate, and exposing the first pad and the second pad. The insulating layer is aligned with the first surface and the second surface of the substrate.

In an embodiment of the disclosure, the substrate mentioned above further has at least one through hole. The conductive structure layer includes a first patterned circuit layer, a second patterned circuit layer, and at least one conducting layer. The conducting layer covers the inner wall of the through hole and connects the first patterned circuit layer on the first surface and the second patterned circuit layer on the second surface. The first patterned circuit layer is structurally and electrically connected to the first pad. The second patterned circuit layer is structurally and electrically connected to the second pad.

In an embodiment of the disclosure, the package carrier mentioned above further includes a first solder mask, a second solder mask, a first surface treatment layer, and a second surface treatment layer. The first solder mask is disposed on the first build-up structure. The first solder mask has a plurality of first openings, and the first openings expose part of the first build-up structure. The second solder mask is disposed on the second build-up structure. The second solder mask has a plurality of second openings, and the second openings expose part of the second build-up structure. The first surface treatment layer is disposed on the first build-up structure exposed by the first openings. The second surface treatment layer is disposed on the second build-up structure exposed by the second openings.

In an embodiment of the disclosure, the package carrier mentioned above further includes a plurality of first solder balls and a plurality of second solder balls. The first solder balls are disposed respectively in the first openings of the first solder mask. The first surface treatment layer is located between the first solder balls and the first build-up structure. The second solder balls are disposed respectively in the second openings of the second solder mask. The second surface treatment layer is located between the second solder balls and the second build-up structure.

The manufacturing method of the package carrier of the disclosure includes the following steps. A substrate having at least one opening is provided. At least one interposer is disposed in the opening of the substrate. Each interposer includes a glass substrate, at least one conductive via, at least one first pad, and at least one second pad. The conductive via passes through the glass substrate, and the first pad and the second pad are disposed respectively on an upper surface and a lower surface of the glass substrate opposite to each other and are connected to the opposite ends of the conductive via. A conductive structure layer is formed on the substrate, in which the conductive structure layer is structurally and electrically connected to the first pad and the second pad. A first build-up structure and a second build-up structure are formed respectively on the first surface and the second surface of the substrate. The first build-up structure and the second build-up structure are electrically connected respectively to the conductive structure layer.

In an embodiment of the disclosure, the manufacturing method of the package carrier mentioned above further includes forming an insulating material layer in the opening of the substrate before forming the conductive structure layer on the substrate. The insulating material layer fills the opening, covers the upper surface and the lower surface of the glass substrate, and extends to cover the first surface of the substrate and the first pad. An insulating layer is formed by removing part of the insulating material layer. The insulating layer exposes the first pad and the second pad, and is aligned with the first surface and the second surface of the substrate.

In an embodiment of the disclosure, the above-mentioned steps of forming the conductive structure layer on the substrate includes forming at least one through hole on the substrate. A conductive material layer is formed on the substrate. The conductive material layer covers the inner wall of the through hole, and extends to cover the insulating layer, the first pad, the second pad, and the first and the second surfaces of the substrate. The conductive material layer is patterned to form the conductive structure layer. The conductive structure layer includes a first patterned circuit layer, a second patterned circuit layer, and at least one conducting layer. The conducting layer covers the inner wall of the through hole and connects the first patterned circuit layer located on the first surface and the second patterned circuit layer located on the second surface. The first patterned circuit layer is structurally and electrically connected to the first pad. The second patterned circuit layer is structurally and electrically connected to the second pad.

In an embodiment of the disclosure, the above-mentioned manufacturing method of the package carrier further includes forming a first solder mask on the first build-up structure. The first solder mask has a plurality of first openings, and the first openings expose part of the first build-up structure. A second solder mask is formed on the second build-up structure. The second solder mask has a plurality of second openings, and the second openings expose part of the second build-up structure. The first surface treatment layer is formed on the first build-up structure exposed by the first openings. The second surface treatment layer is formed on the second build-up structure exposed by the second openings.

In an embodiment of the disclosure, the above-mentioned manufacturing method of the package carrier further includes forming respectively a plurality of first solder balls in the first opening of the first solder mask. The first surface treatment layer is located between the first solder balls and the first build-up structure. The second solder balls are formed respectively in the second openings of the second solder mask. The second surface treatment layer is located between the second solder balls and the second build-up structure.

Based on the above, in the design of the package carrier of the disclosure, the interposer is disposed in the openings of the substrate as a passive component, in which the conductive structure layer is structurally and electrically connected to the first pad and the second pad of the interposer. In other words, only one contact surface exists respectively between the conductive structure layer and the first pad and between the conductive structure layer and the second pad, presenting a configuration with high coplanarity and connections made without blind vias. Furthermore, the interposer may be electrically connected to the conductive structure layer on both sides. In addition to providing better circuit flexibility and utilization, the interposer may also be adapted as a rigid support structure to improve the rigidity of the subsequent packaging structure. Furthermore, since the package carrier of the disclosure is a component embedded package carrier, in addition to having better coplanarity which improves the yield of subsequent chip packages, the disclosure also provides better conductive performance, better structural reliability, and thinner package thickness.

The accompanying drawings are included to provide a further understanding of the disclosure, and are incorporated in and constitute a part of this specification. The drawings illustrate embodiments of the disclosure and, together with the description, serve to explain the principles of the disclosure. The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIGS. 1A to 1H are schematic cross-sectional views of a manufacturing method of a package carrier according to an embodiment of the disclosure. Regarding the manufacturing method of the package carrier of the present embodiment, please first refer to FIG. 1A in which a substrate 110a is provided. Specifically speaking, the substrate 110a of the present embodiment includes a core layer 112, a first copper foil layer 114, and a second copper foil layer 116, in which the first copper foil layer 114 and the second copper foil layer 116 are located respectively on the two opposite surfaces of the core layer 112. Here, the substrate 110a is, for example, a copper foil substrate, and the material of the core layer 112 is, for example, glass fiber, but the disclosure is not limited to this substrate 110a. In other embodiments which are not provided with illustrations, the substrate may also be a BT resin substrate, a plastic substrate, a ceramic substrate, or other suitable substrates.

Figure 1A:
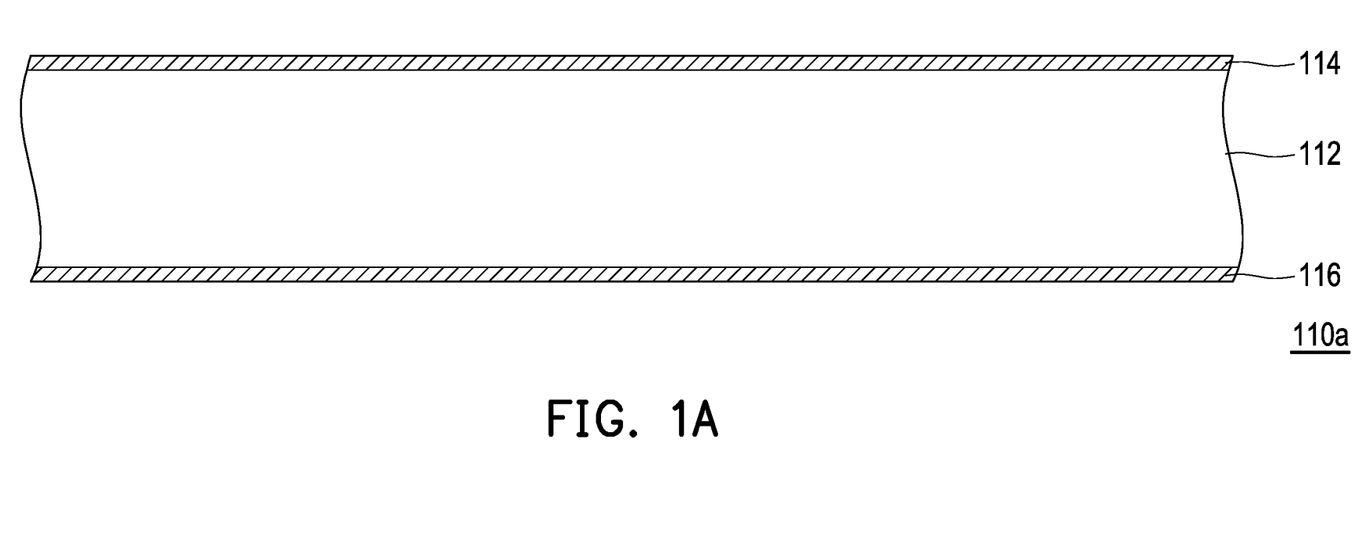
FIGS. 1A to 1H are schematic cross-sectional views of a manufacturing method of a package carrier according to an embodiment of the disclosure.
Figure 1B:
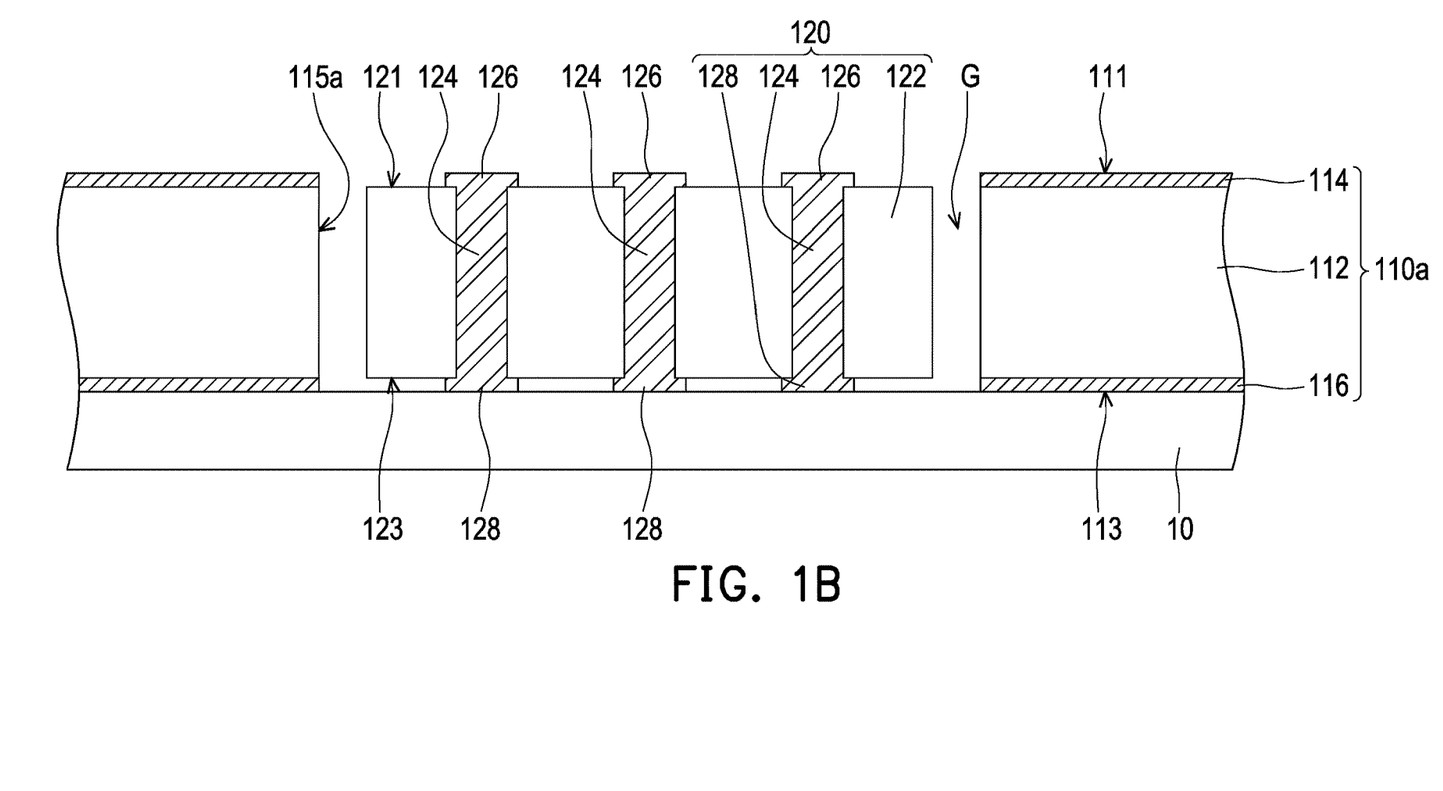

Then, in FIG. 1B, at least one opening 115a (illustrated schematically as one opening 115a) is formed on the substrate 110a, in which the opening 115a passes through the first copper foil layer 114, the core layer 112, and the second copper foil layer 116. So far, the substrate 110a having the opening 115a has been provided.

Next, again in FIG. 1B, an adhesive layer 10 is attached to the substrate 110a, in which the substrate 110a has a first surface 111 and a second surface 113 which are opposite to each other, and the second surface 113 of the substrate 110a is adhered to the adhesive layer 10.

Then, still in FIG. 1B, at least one interposer 120 (illustrated schematically as one interposer 120) is disposed in the opening 115a of the substrate 110a, and is positioned in the opening 115a through the adhesive layer 10. Specifically speaking, the interposer 120 of the present embodiment includes a glass substrate 122, at least one conductive via 124 (illustrated schematically as three conductive vias 124), at least one first pad 126 (illustrated schematically as three first pads 126), and at least one second pad 128 (illustrated schematically as three second pads 128). The conductive via 124 passes through the glass substrate 122, and the first pad 126 and the second pad 128 are respectively disposed on an upper surface 121 and a lower surface 123 of the glass substrate 122 which are opposite to each other, and are connected to the opposite ends of the conductive via 122. In other words, the first pad 126 and the second pad 128 are disposed to correspond to each other and are located at the opposite ends of the conductive via 122. Preferably, the conductive via 122, the first pad 126, and the second pad 128 are made of the same material and are seamlessly connected. Meanwhile, the second pad 128 of the interposer 120 is adhered to the adhesive layer 10, and the interposer 120 is positioned in the opening 115a. As shown in FIG. 1B, the interposer 120 does not contact directly the opening 115a; instead, a gap G exists between the inner wall of the opening 115a and the interposer 120. The first pad 126 may be coplanar with the first surface 111 of the substrate 110a, and the second pad 128 may be coplanar with the second surface 113 of the substrate 110a, but the disclosure is not limited thereto.

Figure 1C:
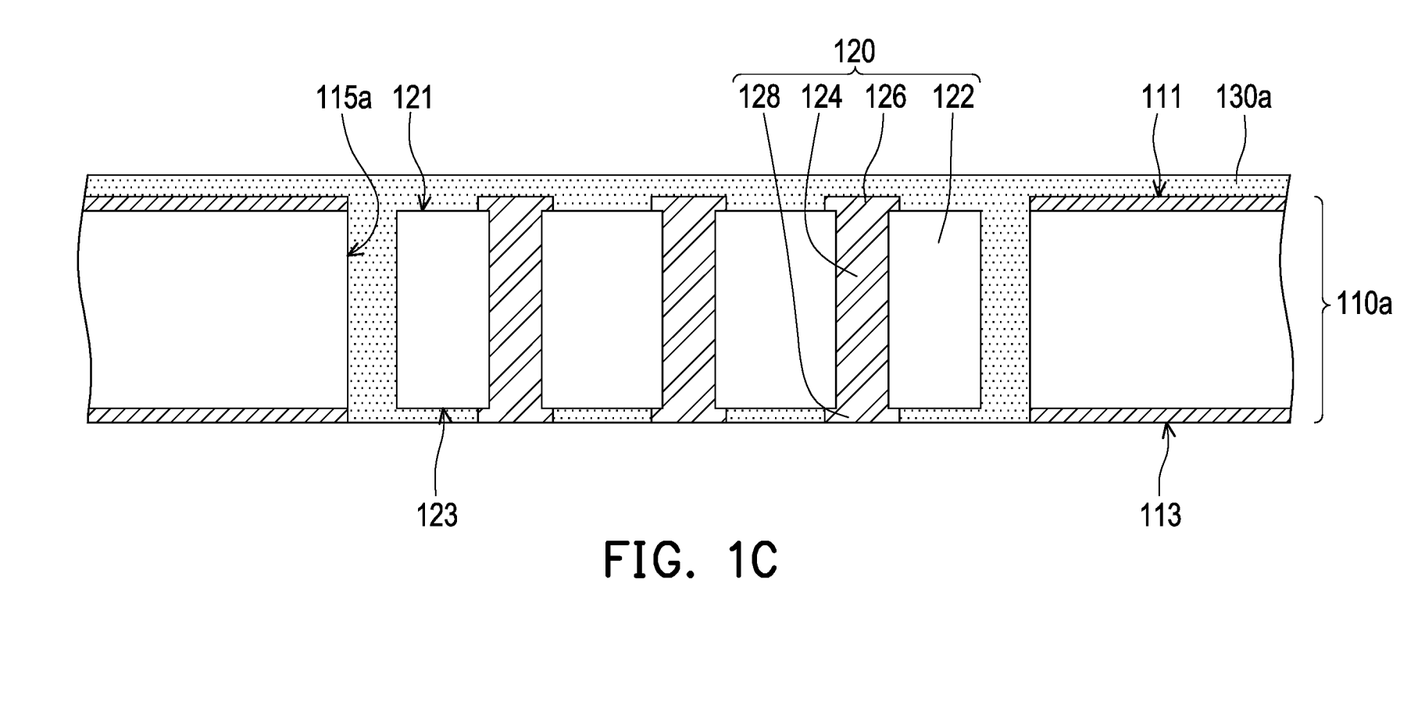

Next, please refer to FIG. 1B and FIG. 1C simultaneously. An insulating material layer 130a is formed in the opening 115a of the substrate 110a by laminating, filling, plugging, etc. to seal the substrate 110a. At the same time, the insulating material layer 130a fills the opening 115a, covers the upper surface 121 and the lower surface 123 of the glass substrate 122, and extends to cover the first surface 111 of the substrate 110a and the first pad 126.

Next, in FIG. 1C, the adhesive layer 10 is removed, exposing the second surface 113 of the substrate 110a, part of the insulating material layer 130a, and the second pads 128.

Figure 1D:
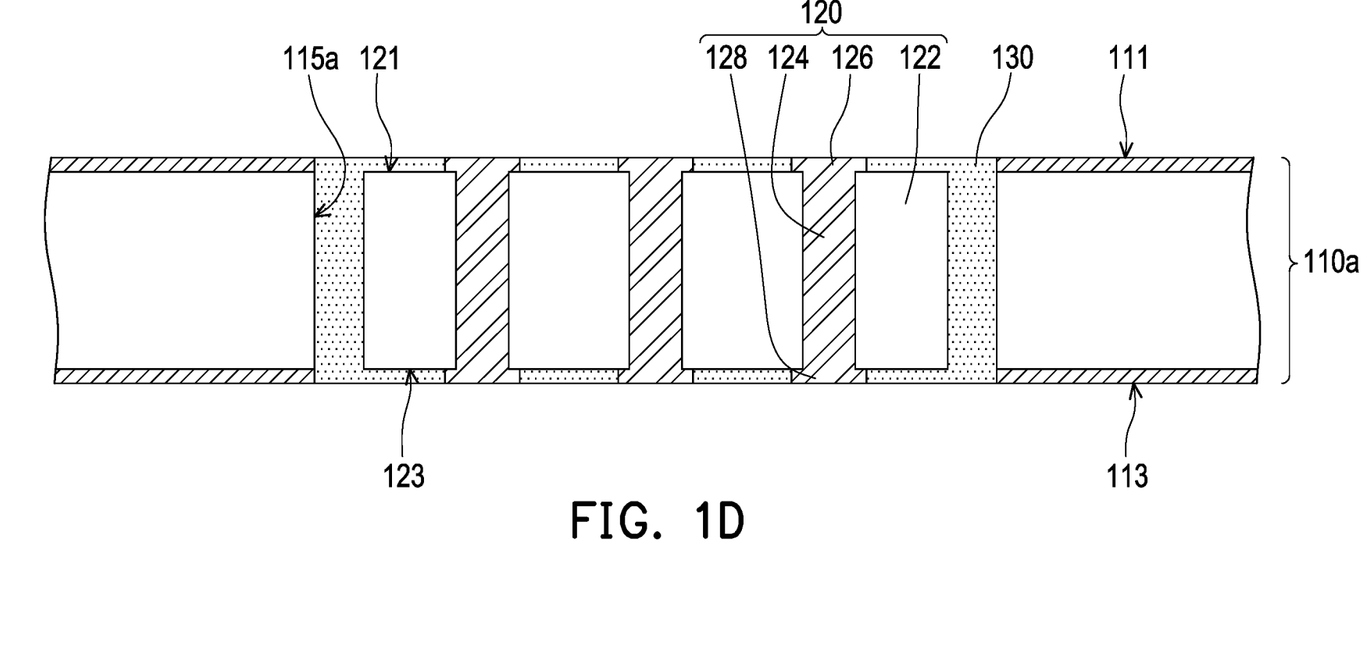

Then, please refer to FIG. 1C and FIG. 1D simultaneously. By means of chemical-mechanical polishing (CMP) or plasma thinning (plasma thinning), etc., part of the insulating material layer 130a is removed to form an insulating layer 130. Meanwhile, the insulating layer 130 exposes the first pad 126 and the second pad 128, and is aligned with the first surface 111 and the second surface 113 of the substrate 110a.

Figure 1E:
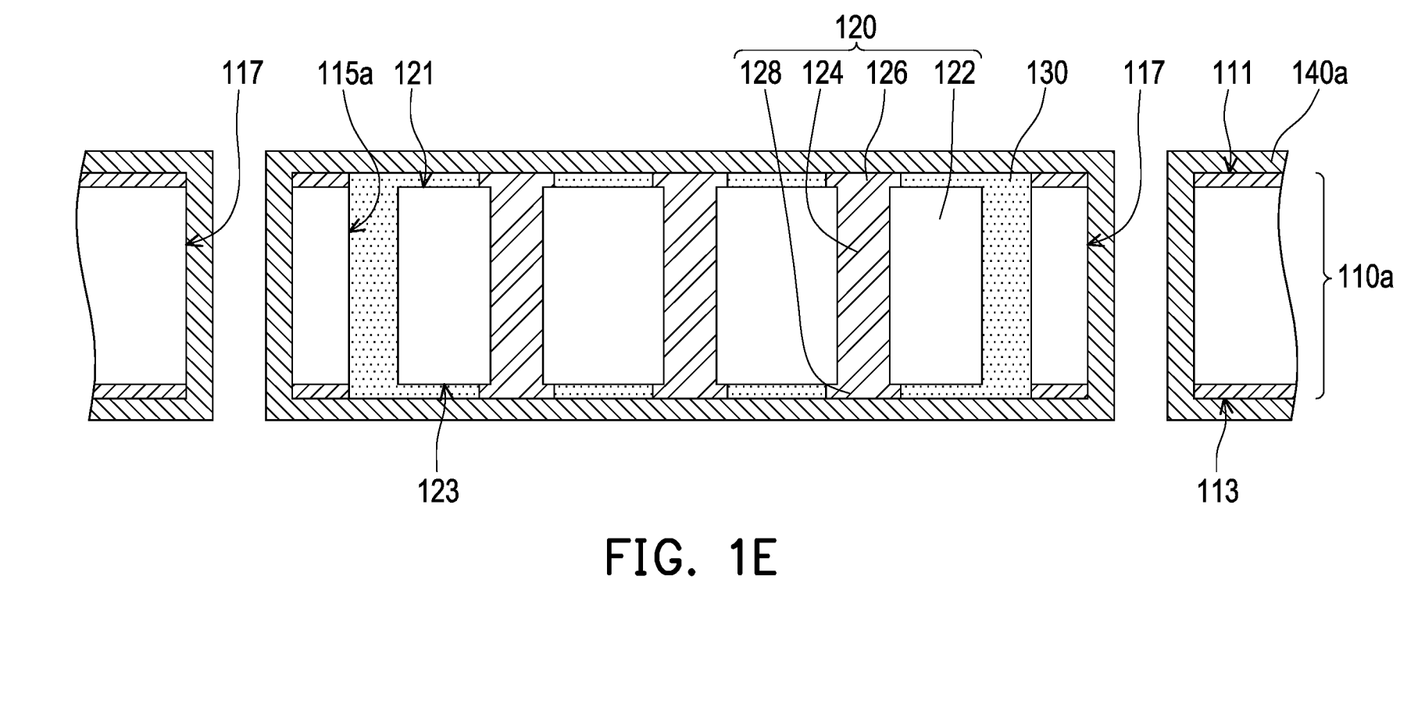

Next, in FIG. 1E, at least one through hole 117 (illustrated schematically as two through holes 117) is formed on the substrate 110a. Then, a conductive material layer 140a is formed on the substrate 110a by electroplating or sputtering, in which the conductive material layer 140a covers the inner wall of the through hole 117 and extends to cover the insulating layer 130, the first pad 126, the second pad 128, and the first surface 111 and the second surface 113 of the substrate 110a. Namely, the entire board is metallized.

Figure 1F:
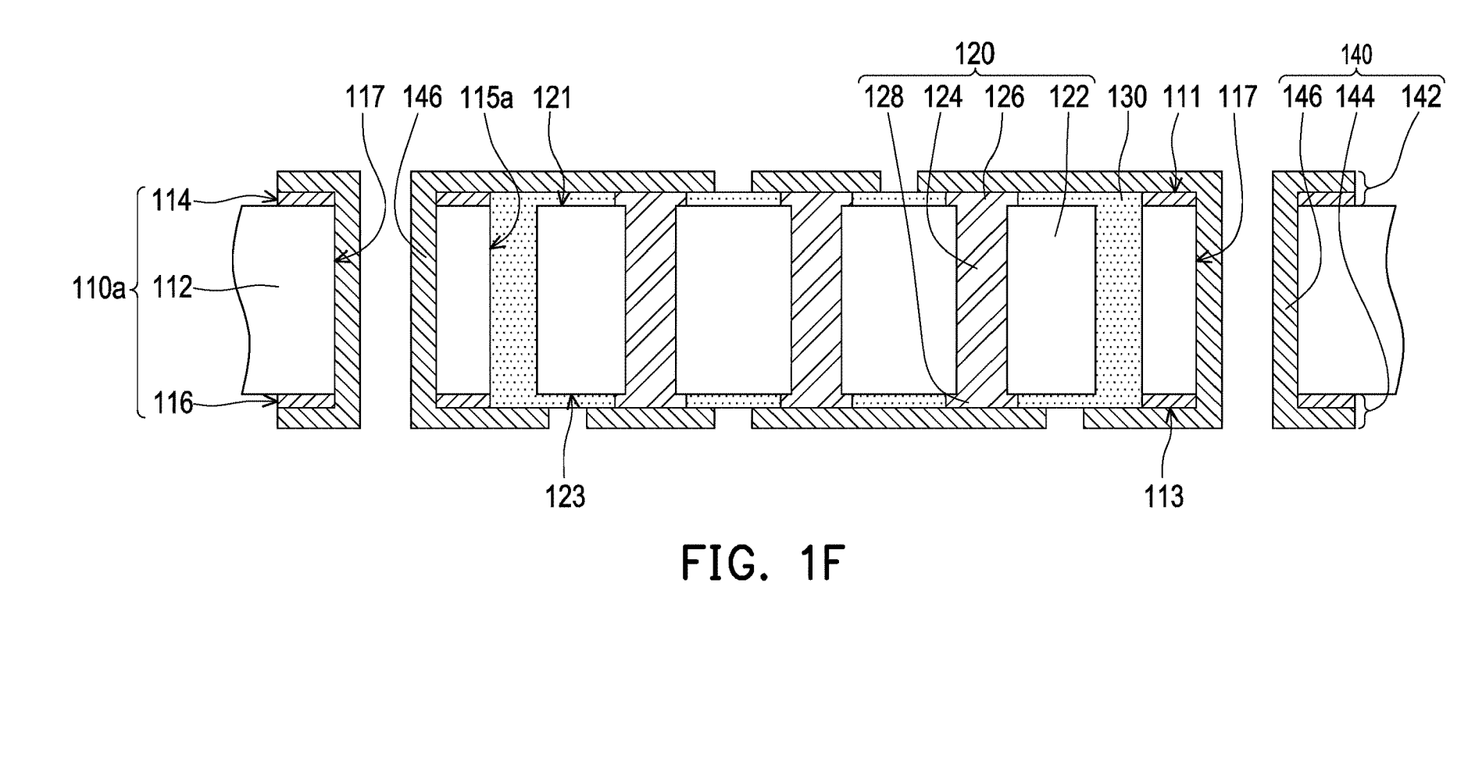

Please then refer to FIG. 1E and FIG. 1F simultaneously. By means of the subtractive method, the conductive material layer 140a is patterned to form a conductive structure layer 140. The conductive structure layer 140 includes a first patterned circuit layer 142, a second patterned circuit layer 144, and at least one conducting layer 146 (illustrated schematically as two conducting layers 146). The conducting layers 146 covers the inner wall of the through hole and connects the first patterned circuit layer 142 located on the first surface 111 and the second patterned circuit layer 144 located on the second surface 113. Namely, the conducting layer 146 is adapted for conducting the first patterned circuit layer 142 and the second patterned circuit layer 144. Here, the conductive structure layer 140 exposes part of the surface of the core layer 112 of the substrate 110a, and the first patterned circuit layer 142 includes the remaining first copper foil layer 114, and the second patterned circuit layer 144 includes the remaining second copper foil layer 116. Particularly, the first patterned circuit layer 142 and the first pad 126 are structurally and electrically connected, and the second patterned circuit layer 144 and the second pad 128 are structurally and electrically connected. Meanwhile, only one contact plane exists between the first patterned circuit layer 142 and the first pad 126, and only one contact plane exists between the second patterned circuit layer 144 and the second pad 128, which may provide a larger contact area, better conductivity, and better connection reliability, presenting a configuration with high coplanarity and connections made without blind vias.

So far, the conductive structure layer 140 has been formed on the substrate 110a, in which the conductive structure layer 140 is structurally and electrically connected to the first pad 126 and the second pad 128 of the interposer 120.

Figure 1G:
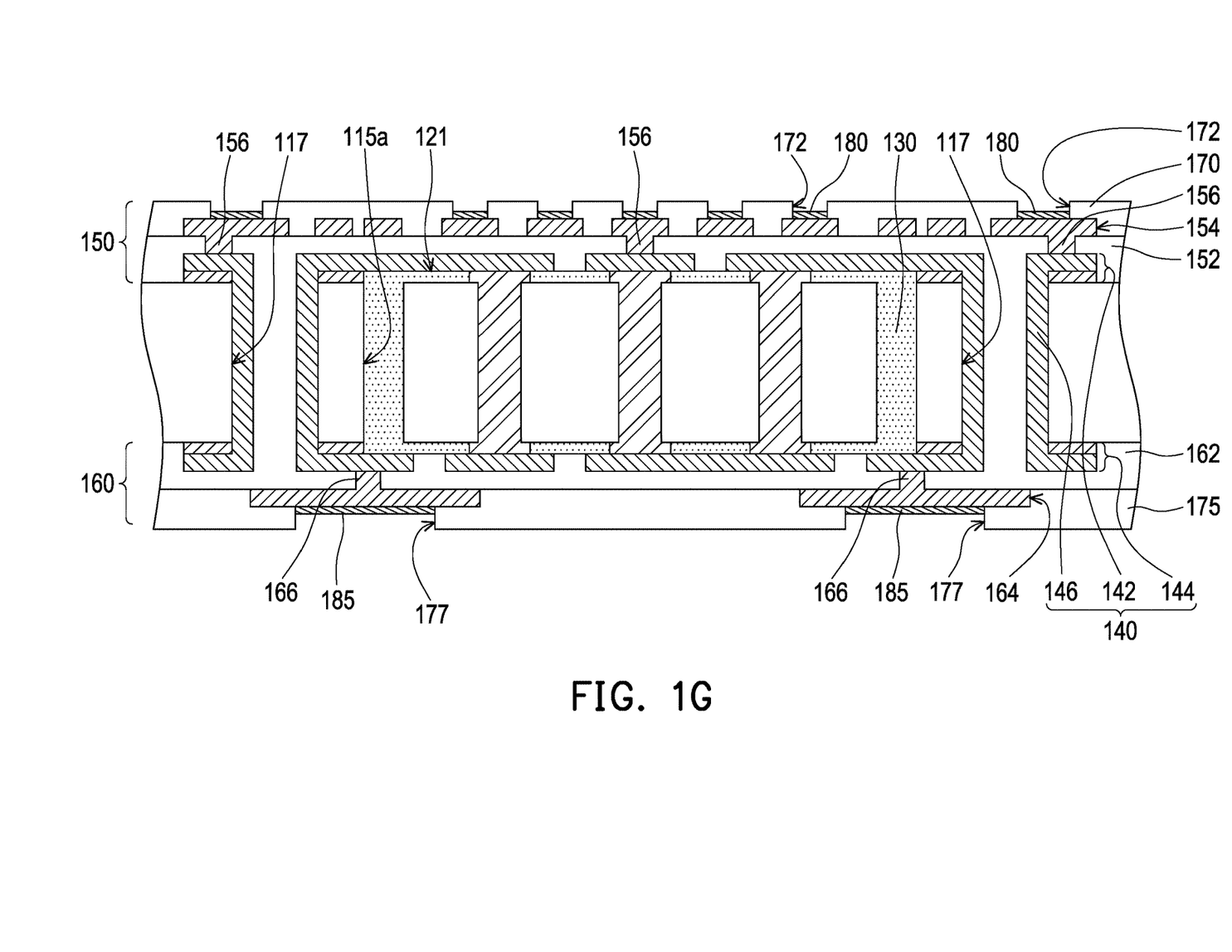

Next, in FIG. 1G, a first build-up structure 150 and a second build-up structure 160 are formed respectively on the first surface 111 and the second surface 113 of the substrate 110a. The first build-up structure 150 and the second build-up structure 160 are electrically connected to the conductive structure layer 140 respectively. Specifically speaking, the first build-up structure 150 includes at least one dielectric layer 152 (illustrated schematically as one dielectric layer 152), at least one circuit layer 154 (illustrated schematically as one circuit layer 154), and at least one conductive blind hole 156 (schematically illustrates as a plurality of conductive blind holes 156). The dielectric layer 152 at least covers the first patterned circuit layer 142 and fills the through hole 117. The circuit layer 154 is disposed on the dielectric layer 152 and is electrically connected to the first patterned circuit layer 142 through the conductive blind hole 156. The second build-up structure 160 includes at least one dielectric layer 162 (illustrated schematically as one dielectric layer 162), at least one circuit layer 164 (illustrated schematically as one circuit layer 164), and at least one conductive blind hole 166 (schematically illustrates as a plurality of conductive blind holes 166). The dielectric layer 162 at least covers the second patterned circuit layer 144 and fills the through hole 117. The circuit layer 164 is disposed on the dielectric layer 162 and is electrically connected to the second patterned circuit layer 144 through the conductive blind hole 166.

Then, again in FIG. 1G, a first solder mask 170 is formed on the first build-up structure 150, and a second solder mask 175 is formed on the second build-up structure 160. The first solder mask 170 has a plurality of first openings 172, and the first opening 172 exposes part of the circuit layer 154 of the first build-up structure 150. The second solder mask 175 has a plurality of second openings 177, and the second opening 177 exposes part of the circuit layer 164 of the second build-up structure 160. Next, a first surface treatment layer 180 is formed on part of the circuit layer 154 of the first build-up structure 150 exposed by the first opening 172, and a second surface treatment layer 185 is formed on part of the circuit layer 164 of the second build-up structure 160 exposed by the second opening 177. The above configurations protect the circuit layer 154 and the circuit layer 164 respectively.

Figure 1H:
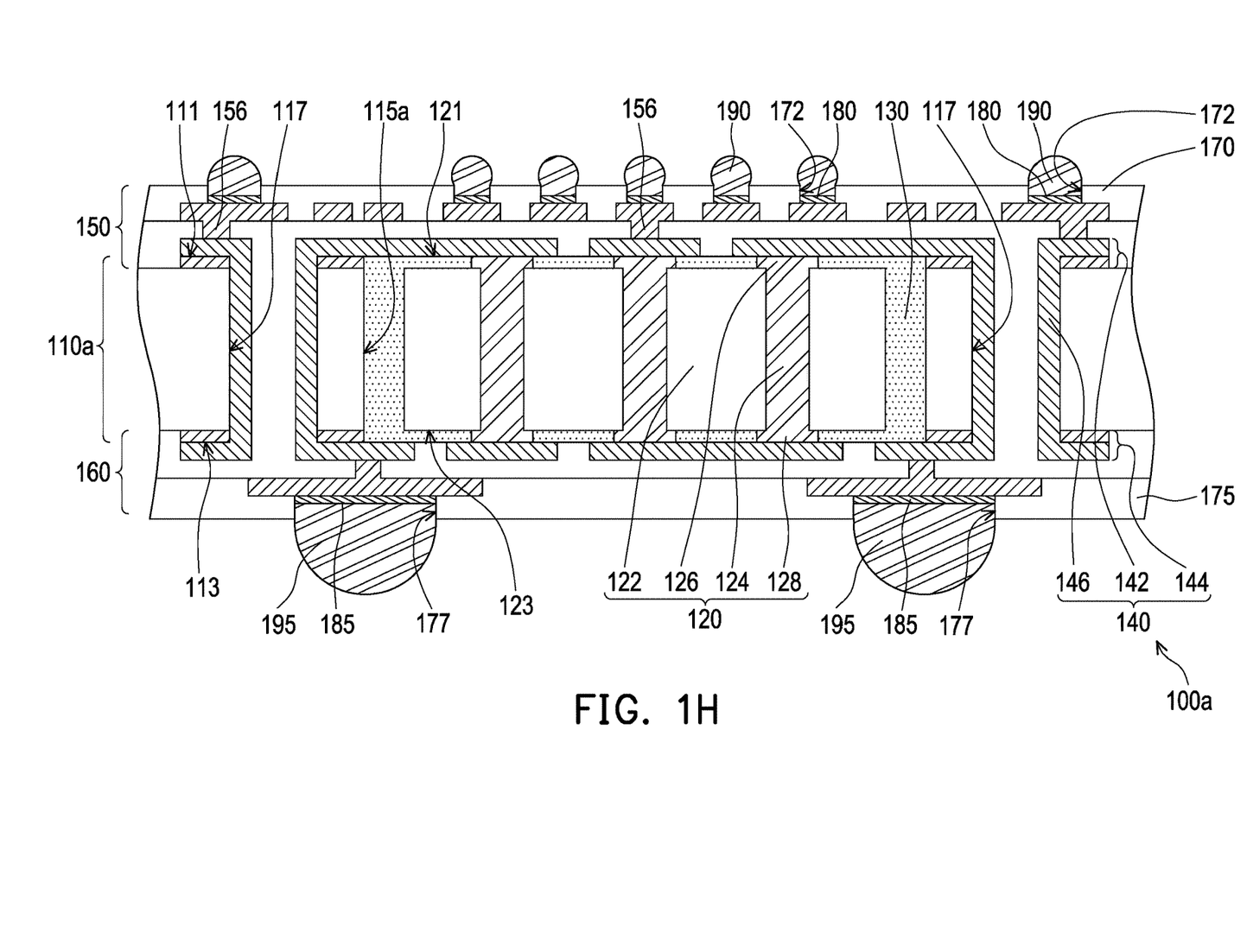

Lastly, in FIG. 1H, a plurality of first solder balls 190 are respectively formed in the first openings 172 of the first solder mask 170, in which the first surface treatment layer 180 is located between the first solder ball 190 and the first build-up structure 150. A plurality of second solder balls 195 are formed respectively in the second openings 177 of the second solder mask 175, in which the second surface treatment layer 185 is located between the second solder ball 195 and the second build-up structure 160. Here, the size of the first solder ball 190 is actually smaller than the size of the second solder ball 195, in which the first solder ball 190 is adapted to be electrically connected to a passive element, an active element, or other chips with a smaller size whereas the second solder ball 195 is suitable to be electrically connected to a package or other electronic devices with a larger size. So far, the manufacturing of the package carrier 100a has been completed.

In terms of structure, in FIG. 1H again, the package carrier 100a includes the substrate 110a, the interposer 120, the conductive structure layer 140, the first build-up structure 150, and the second build-up structure 160. The substrate 110a has the first surface 111 and the second surface 113 which are opposite to each other and the opening 115a connecting the first surface 111 and the second surface 113. The interposer 120 is disposed in the opening 115a of the substrate 110a, and the interposer 120 includes the glass substrate 122, the conductive via 124, the first pad 126, and the second pad 128. The conductive via 124 passes through the glass substrate 122, and the first pad 126 and the second pad 128 are disposed respectively on the upper surface 121 and the lower surface 123 of the glass substrate 122 which are opposite to each other, and are connected to the opposite ends of the conductive via 124. The conductive structure layer 140 is disposed on the substrate 110a and is structurally and electrically connected to the first pad 126 and the second pad 128. The first build-up structure 150 is disposed on the first surface 111 of the substrate 110a and is electrically connected to the conductive structure layer 140. The second build-up structure 160 is disposed on the second surface 113 of the substrate 110a and is electrically connected to the conductive structure layer 140.

Furthermore, the package carrier 100a of the present embodiment further includes the insulating layer 130, in which the insulating layer 130 fills the opening 115a of the substrate 110a, covers the upper surface 121 and the lower surface 123 of the glass substrate 120, and exposes the first pad 126 and the second pad 128. Preferably, the insulating layer 130 is aligned with the first surface 111 and the second surface 113 of the substrate 110a. The substrate 110a of the present embodiment further includes the through hole 117, and the conductive structure layer 140 includes the first patterned circuit layer 142, the second patterned circuit layer 144, and the conducting layer 146. The conducting layer 146 covers the inner wall of the through hole 117 and connects the first patterned circuit layer 142 located on the first surface 111 and the second patterned circuit layer 144 located on the second surface 113. The first patterned circuit layer 142 is structurally and electrically connected to the first pad 126. The second patterned circuit layer 144 is structurally and electrically connected to the second pad 128.

Furthermore, the package carrier 100a of the present embodiment further includes the first solder mask 170, the second solder mask 175, the first surface treatment layer 180, and the second surface treatment layer 185. The first solder mask 170 is disposed on the first build-up structure 150, in which the first solder mask 170 has the first opening 172, and the first opening 172 exposes part of the first build-up structure 150. The second solder mask 175 is disposed on the second build-up structure 160, in which the second solder mask 175 has the second opening 177, and the second opening 177 exposes part of the second build-up structure 160. The first surface treatment layer 180 is disposed on the first build-up structure 150 exposed by the first opening 172. The second surface treatment layer 185 is disposed on the second build-up structure 160 exposed by the second opening 177.

In addition, in order to be electrically connected to an external circuit, the package carrier 100a of the present embodiment further includes multiple first solder balls 190 and multiple second solder balls 195. The first solder balls 190 are disposed respectively in the first openings 172 of the first solder mask 170, in which the first surface treatment layer 180 is located between the first solder ball 190 and the first build-up structure 150. The second solder balls 195 are disposed respectively in the second openings 177 of the second solder mask 175, in which the second surface treatment layer 185 is located between the second solder ball 195 and the second build-up structure 160.

The interposer 120 of the present embodiment is based on the glass substrate 122 which has high rigidity, high flatness, and high dimensional stability, and the conductive structure layer 140 is connected directly to the first pad 126 and the second pad 128. In other words, only one contact surface exists between the conductive structure layer 140 and the first pad 126 and only one contact surface exists between the conductive structure layer 140 and the second pad 128, which provides a larger contact area, better conductivity, and better connection reliability, presenting a configuration with high coplanarity and connections made without blind vias. In short, the interposer 120 of the present embodiment may be electrically connected to the conductive structure layer 140 on both sides. In addition to providing better circuit flexibility and utilization, the interposer 120 may also be adapted as a rigid support structure to improve the rigidity of the subsequent packaging structure.

Furthermore, since the interposer 120 of the present embodiment provides a contact connection structure which has high rigidity, high coplanarity, and high flatness, the first solder balls 190 and the second solder balls 195 which are electrically connected to the external circuit on the interposer 120 are formed subsequently to form wafer connection points with high coplanarity. In addition, since the interposer 120 is disposed in the opening 115 of the substrate 110a in the present embodiment, it may be regarded as a passive component. Therefore, the package carrier 100a of the present embodiment may be considered a component embedded package carrier. In addition to having better coplanarity which improves the yield of subsequent chip packages, the disclosure also provides better conductive performance, better structural reliability, and thinner package thickness.

It is to be noted that the following embodiments use the reference numerals and a part of the contents of the above embodiments, and the same reference numerals are used to denote the same or similar elements, and the description of the same technical contents is omitted. For the description of the omitted part, reference may be made to the above embodiments, and details are not described in the following embodiments.

Figure 2:
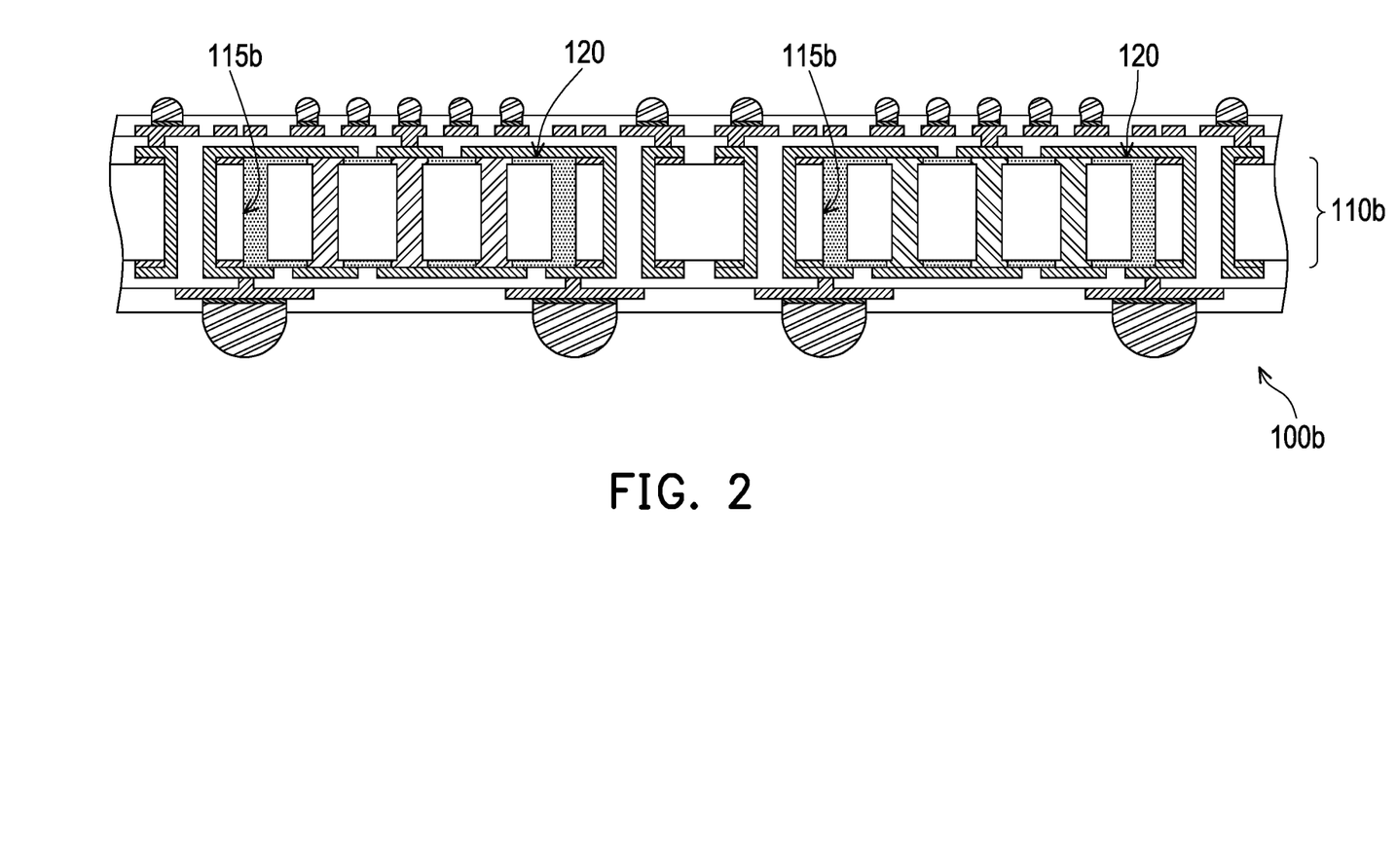
FIG. 2 is a schematic cross-sectional view of a package carrier according to an embodiment of the disclosure.
Figure 3:
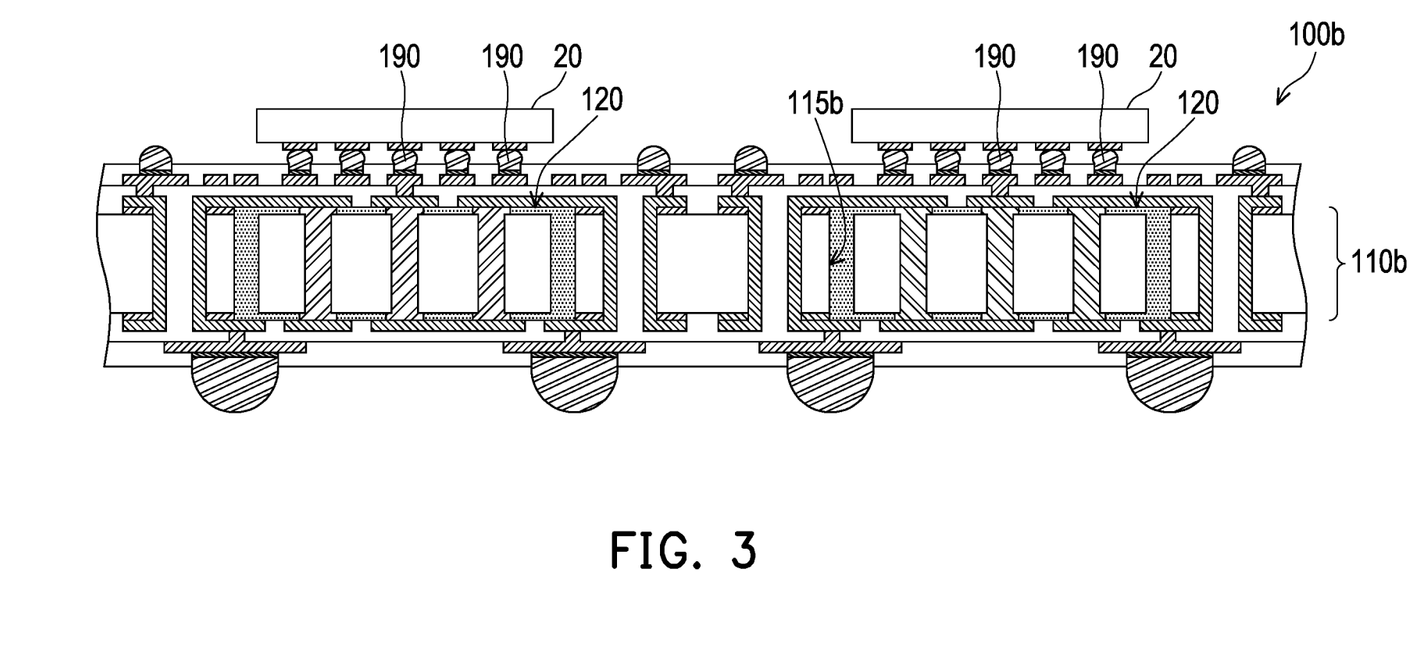
FIG. 3 is a schematic cross-sectional view of the package carrier according to an FIG. 2 on which a plurality of chips are packaged.

FIG. 2 is a schematic cross-sectional view of a package carrier according to an embodiment of the disclosure. FIG. 3 is a schematic cross-sectional view of the package carrier according to an FIG. 2 on which a plurality of chips are packaged. First, in FIG. 2, a package carrier 100b of the present embodiment is similar to the package carrier 100a of FIG. 1H. The difference between the two is that the substrate 110b of the present embodiment has a plurality of openings 115b (illustrated schematically as two openings 115b), and that a plurality of interposers 120 (illustrated schematically as two interposers 120) are disposed respectively in the openings 115b. In terms of application, in FIG. 3, at least one chip 20 (illustrated schematically as two chips 20) may be bonded to the package carrier 100b through the first solder balls 190. In other words, the package carrier 100b of the present embodiment realizes multi-chip packaging by disposing multiple interposers 120. In addition to improving the yield of chip packaging, it may also meet the needs of modularization.

In sum, in the design of the package carrier of the disclosure, the interposer is disposed in the opening of the substrate as a passive component, in which the conductive structure layer is structurally and electrically connected to the first pad and the second pad of the interposer. In other words, there is only one contact surface respectively between the conductive structure layer and the first pad and between the conductive structure layer and the second pad, presenting a configuration with high coplanarity and connections made without blind vias. Furthermore, the interposer may be electrically connected to the conductive structure layer on both sides. In addition to providing better circuit flexibility and utilization, the interposer may also be adapted as a rigid support structure to improve the rigidity of the subsequent packaging structure. Furthermore, since the package carrier of the disclosure is a component embedded package carrier, in addition to having better coplanarity which improves the yield of subsequent chip packages, the disclosure also provides better conductive performance, better structural reliability, and thinner package thickness.

Although the disclosure has been disclosed by the above embodiments, they are not intended to limit the disclosure. To any one of ordinary skill in the art, modifications and embellishment to the disclosed embodiments may be made without departing from the spirit and the scope of the disclosure. Accordingly, the scope of the disclosure is defined by the claims attached below and their equivalents.

What is claimed is:

1. A manufacturing method of a package carrier, comprising:
    providing a substrate having at least one opening;
    disposing at least one interposer in the at least one opening of the substrate, wherein each of the interposer comprises a glass substrate, at least one conductive via, at least one first pad, and at least one second pad, the at least one conductive via passes through the glass substrate, and the at least one first pad and the at least one second pad are disposed respectively on an upper surface and a lower surface of the glass substrate opposite to each other and are connected to opposite ends of the conductive via;
    forming a conductive structure layer on the substrate, wherein the conductive structure layer is structurally and electrically connected to the at least one first pad and the at least one second pad; and
    forming a first build-up structure and a second build-up structure respectively on the first surface and the second surface of the substrate, wherein the first build-up structure and the second build-up structure are electrically connected respectively to the conductive structure layer.

2. The package carrier according to claim 1, further comprising:
    forming an insulating material layer in the at least one opening of the substrate before forming the conductive structure layer on the substrate, wherein the insulating material layer fills the at least one opening, covers the upper surface and the lower surface of the glass substrate, and extends to cover the first surface of the substrate and the at least one first pad; and
    removing part of the insulating material layer to form an insulating layer, wherein the insulating layer exposes the at least one first pad and the at least one second pad, and the insulating layer is aligned with the first surface and the second surface of the substrate.

3. The manufacturing method of the package carrier according to claim 2, wherein forming the conductive structure layer on the substrate comprises:
    forming at least one through hole on the substrate;
    forming a conductive material layer on the substrate, wherein the conductive material layer covers an inner wall of the through hole, and extends to cover the insulating layer, the at least one first pad, the at least one second pad, and the first and second surfaces of the substrate; and
    patterning the conductive material layer to form the conductive structure layer, wherein the conductive structure layer comprises a first patterned circuit layer, a second patterned circuit layer, and at least one conducting layer, the at least one conducting layer covers an inner wall of the at least one through hole and connects the first patterned circuit layer located on the first surface and the second patterned circuit layer located on the second surface, the first patterned circuit layer and the at least one first pad are structurally and electrically connected, and the second patterned circuit layer and the at least one second pad are structurally and electrically connected.

4. The manufacturing method of the package carrier according to claim 1, further comprising:
    forming a first solder mask on the first build-up structure, wherein the first solder mask has a plurality of first openings, and the first openings expose part of the first build-up structure;
    forming a second solder mask on the second build-up structure, wherein the second solder mask has a plurality of second openings, and the second openings expose part of the second build-up structure;
    forming a first surface treatment layer on the first build-up structure exposed by the first openings; and
    forming a second surface treatment layer on the second build-up structure exposed by the second openings.

5. The manufacturing method of the package carrier according to claim 4, further comprising:
    forming a plurality of first solder balls respectively in the first openings of the first solder mask, wherein the first surface treatment layer is located between the first solder balls and the first build-up structure; and
    forming a plurality of second solder balls respectively in the second openings of the second solder mask, wherein the second surface treatment layer is located between the second solder balls and the second build-up structure.

* * * * *